United States Patent [19]

Misium et al.

[11] Patent Number: 5,320,934
[45] Date of Patent: Jun. 14, 1994

[54] BILAYER PHOTOLITHOGRAPHIC PROCESS

[76] Inventors: George R. Misium, 13450 Maham #733, Dallas, Tex. 75240; Charles B. Dobson, 725 DeLeon, Denison, Tex. 75020

[21] Appl. No.: 26,632

[22] Filed: Mar. 5, 1993

Related U.S. Application Data

[63] Continuation of Ser. No. 722,996, Jun. 28, 1991, abandoned.

[51] Int. Cl.$^5$ .............................................. G03F 7/40
[52] U.S. Cl. .................................. 430/315; 430/316; 430/323; 430/324; 430/313; 156/643
[58] Field of Search ............. 430/312, 313, 314, 315, 430/318, 323, 324, 5, 316; 156/643

[56] References Cited

U.S. PATENT DOCUMENTS

| | | | |
|---|---|---|---|
| 4,564,584 | 1/1986 | Fredericks et al. | 430/318 |
| 4,599,243 | 7/1986 | Sachdev et al. | 430/314 |
| 4,608,332 | 8/1986 | Ward | 430/296 |
| 4,613,398 | 9/1986 | Chiong et al. | 430/323 |
| 4,634,874 | 1/1987 | Ward | 250/492.2 |
| 4,652,762 | 3/1987 | Ward | 250/492.2 |
| 4,695,732 | 9/1987 | Ward | 250/492.2 |
| 4,705,956 | 11/1987 | Ward | 250/492.2 |
| 4,751,170 | 6/1988 | Mimuro et al. | 430/312 |
| 5,024,896 | 6/1991 | Mathad et al. | 430/312 |
| 5,108,875 | 4/1992 | Thackeray et al. | 430/313 |
| 5,126,231 | 6/1992 | Levy | 430/316 |

OTHER PUBLICATIONS

"Positive Resist Image by Dry Etching", J. Vac. Sci. Technol. B 7 (6) Nov./Dec. '89, by C. Pierrat et al.
Ward, R., et al., "Electron Stepper", J. Vac. Sci. Technol. B 4(1), Jan./Feb. 1986, pp 89-93.
Livesay, W. R., et al., "An Electron Image Projection Stepper", J. Vac. Sci. Technol. B 4(1), Jan./Feb. 1986, pp. 100-104.
Paraszczak, J., et al., "The Use of Organosilicon Polymers in Multilayer Plasma Resist Processing", Microelectronic Engineering, vol. 6 (1987), pp. 453-460.
Visser, Robert-Jan, et al., "Mechanism and Kinetics of Silylation of Resist Layers from the Gas Phase", SPIE, vol. 811, Optical Microlithographic Technology for Integrated Circuit Fabrication and Inspection (1987), pp. 62-68.
Hartney, Mark A., et al., "Oxygen Reactive Ion Etching for Multilevel Lithography", SPIE, Advances in Resist Technology and Processing IV, vol. 771, (1987), pp. 353-357.
Paraszczak, J., et al., "Theoretical Analysis of Electron-Beam Exposure Parameters and Etching Selectivity Upon Organosilicon Bilayer Resist Images", J. Vac. Sci. Technol. B 5(1), Jan./Feb. 1987, pp. 129-134.
Till, S. J., et al., "Reactive Ion Etching of Polyimide for Multi-Level Resist and Contact Hole Applications", Microelectronic Engineering, 3 (1985), pp. 491-498.
Paraszczak, J., et al., "Multilayer Resist Systems Using Polysiloxanes as Etch Masks", SPIE, Electron-Beam, X-Ray, and Ion-Beam Techniques for Submicron Lithographies II, vol. 393, pp. 8-19.

Primary Examiner—Christopher Rodee
Attorney, Agent, or Firm—Chris D. Pylant; Richard A. Stoltz; James C. Kesterson

[57] ABSTRACT

In a process for creating a mask on the surface of an integrated circuit workpiece, a first layer of resist is applied to the surface of the workpiece. An upper portion of this first layer is metallized. A second layer of photoresist is applied to the first layer. The second layer of photoresist is selectively exposed and developed. Using the developed second layer as a mask, exposed respective areas of the metallized upper portion of the first layer are etched, and the non-metallized portions of the first layer are subsequently etched. The result is a metallized mask on the surface of the workpiece that avoids the problems of high topographical relief and irradiation reflections from the workpiece surface.

17 Claims, 1 Drawing Sheet

BILAYER PHOTOLITHOGRAPHIC PROCESS

RELATED APPLICATIONS

This is a continuation application of U.S. patent application Ser. No. 07/722,996 filed Jun. 28, 1991, entitled "Bilayer Photolithographic Process" by George R. Misium and Charles B. Dobson, now abandoned.

TECHNICAL FIELD OF THE INVENTION

The present invention relates in general to photolithographic techniques for integrated circuit fabrication, and more particularly to bilayer photolithographic processes.

BACKGROUND OF THE INVENTION

Surface imaging lithography is a major requirement for patterning current integrated circuit layers. Small critical dimensions coupled with severe wafer topography and radiation reflection from the integrated circuit surface make the patterning of certain integrated circuit levels extremely difficult using standard lithographic techniques. Further, the use of high numerical aperture or short wavelength steppers reduces the focus budget for any lithography process. Consequently, the patterning of most levels for advanced circuit technologies requires the use of new non-standard lithographic processes.

Three basic surface-imaging technologies have been heretofore proposed. A first of these basic technologies is the group of single-layer technologies, including the DESIRE ® process. Other surface-imaging technologies include bilayer processes, including SABRE, and various trilayer processes.

The DESIRE ® process was introduced by B. Roland, R. Lombaerts and F. Coopmans in their paper "DESIRE: A New Approach for Silicon Incorporation In Dry Developed Resists", 1986 *Dry Process Symposium*, Pages 98–103. This process requires the use of a special resist. Only negative-tone resist for the DESIRE process is currently available, which leads to duplication of stepper reticles as well as to limitations for exposing levels such as contacts. This process is sensitive to many process parameters and requires tight control of silylation and etching conditions, especially temperatures, to obtain reproducible results.

With standard bilayer processes, a special resist is required for the top layer, which doubles as both the imaging and the silylable layer. No resist combining these two functions in an acceptable manner has been commercially available. One of the major drawbacks of the standard bilayer processes is the swelling of the imaging layer during silylation. Typical of the standard bilayer processes is the process disclosed in McColgin, William C et al. "Silicon-Added Bilayer Resist (SABRE) System", Proceeddings SPIE, Volume 920 pages 2–9.

Finally, there are trilayer processes. In these processes, the following problems are associated with the use of an oxide, or any other masking material, to form the intermediate layer: cracking of the resist due to different thermal expansion coefficients for the intermediate and bottom/top layers, particle formation during the deposition of the intermediate layer, and difficult cleaning of the hard-baked bottom layer. To summarize, several schemes have been proposed to solve problems associated with high-relief integrated circuit topography and radiation reflection problems. Nevertheless, a need persists in the industry for a microlithography system that demonstrates the processing and manufacturing characteristics necessary for acceptance as a standard lithography technique.

SUMMARY OF THE INVENTION

In solution to this need, the inventors disclose a process for creating a mask on the surface of an integrated circuit work piece. According to the process of the invention, a first layer of resist is applied to the surface of the workpiece. The upper surface of the first layer is exposed to an organometallic compound. Responsive to this exposure, an upper portion of the first layer adjacent the upper surface is metallized, with a lower portion of the first layer remote from the upper surface left unmetallized. A second layer of resist is then applied to the upper surface of the first layer. This second layer is chosen to be photosensitive to at least one preselected wavelength of light, such as the G or X-lines of ultraviolet, or deep ultraviolet light. The selectively exposed second layer is then developed to create a pattern (including one or more orifices) in the second layer and to uncover respective areas of the upper surface of the metallized upper portion of the first layer. Using the developed second layer as a mask, respective areas of the metallized upper portion of the first layers are etched using an etch specific to the metallized upper portion and non-specific to the second layer, to expose corresponding areas of the unmetallized lower portion of the first layer. Then, using the etched metallized upper portion as a mask, the respective areas of the lower portion of the first layer are etched to expose respective portions of the surface of the workpiece. This last step results in a mask on the surface of the workpiece that can be used for any of several semiconductor manufacturing techniques, such as implantation, deposition or etching.

In a preferred embodiment, the thickness of the first layer of resist is greater than the total relief between the lowest and highest topographical feature on the surface of the semiconductor workpiece to allow sufficient thickness to cover the topography in a planarized fashion.

The process herein disclosed confers several technical advantages. It combines the advantages of a dry developed single-layer surface-imaging process with that of a trilayer process. As with the trilayer process, the top layer is patterned using standard resist. In addition, as with most surface-imaging technologies, the process according to the invention has topography and substrate insensitivity, anisotropic etching, no standing-wave effects, and reduced depth-of-focus requirements. A further technical advantage is that the process requires no special resist formulations but instead may use only resists which are commercially available. Perhaps the single most important technical advantage is that the technique requires only one critical step, which makes it particularly useful for high-volume manufacturing applications.

BRIEF DESCRIPTION OF THE DRAWINGS

Further aspects of the invention and their advantages may be discerned by reviewing the following detailed description when taken in conjunction with the drawings, in which.

DETAILED DESCRIPTION OF THE INVENTION

Figure 1:
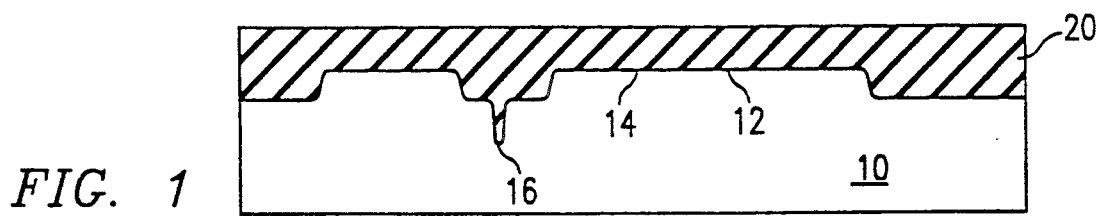
FIGS. 1–5 are highly magnified schematic sectional elevational sectional views of an integrated circuit workpiece, showing successive stages in the formation of a microphotolithographic mask on the workpiece according to the invention.

Referring first to FIG. 1, a semiconductor workpiece 10, such as forms a portion of a wafer, is provided on which the microphoto-lithographic mask is to be fabricated. The workpiece 10 may be, for example, any of the variety of integrated circuits under any one of several phases of fabrication. The workpiece 10 has an upper surface 12 which may have a relatively high relief or height difference between a highest point 14 of the top topography and a lowest point 16. The surface 12 may also be relatively reflective. These topographical characteristics have caused degradation of prior art microlithographic techniques, but neither of these characteristics presents a problem to the disclosed process.

In a first step according to the invention, a first, planarizing layer 20 of standard resist is spun on to the surface 12 of the workpiece 10. The resist may consist of any silylable polymer, such as a resist made of standard novolak resin. Silylable photoresist such as UCB's "PLASMASK ®" and MacDermid's 1024 may be used for this layer. It is unnecessary for this layer to have any photoactive compound (PAC) in it, or contain any functional groups which are photolabile. All that is necessary is that a polymer in this resist have a large enough number of sites that are capable of bonding to silicon or other metal atoms, such as hydroxyl groups. While for economic reasons it is preferred to use a resist without a photoactive compound in it, a photoresist can also be used. In the instance where a negative-tone surface-imaging resist is used, the photoresist should be flood-exposed in order to activate the photoresist so that it might later react with silicon or other metal used to metallize a portion of the resist layer 20. Preferably, the resist layer 20 is spun on to a sufficient thickness that its top surface is planarized, even in view of a relatively extreme topographical relief of surface 12.

Figure 2:
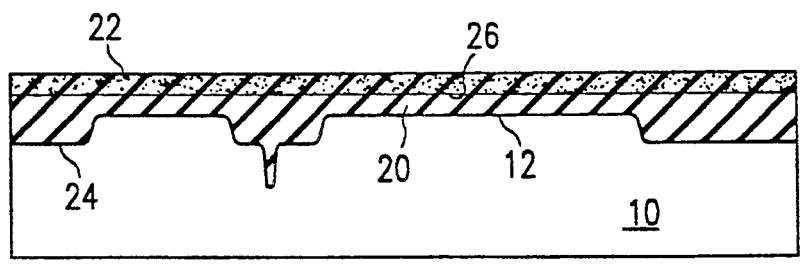

Referring next to FIG. 2, an upper portion 22 of the first layer 20 is silylated, leaving an unsilylated portion 24 of the first resist layer 20. The silylation may take place by any of various methods. According to one preferred method, nitrogen is used to carry a vapor of an organosilicon compound into a reaction chamber containing the workpiece 10, so that a full thickness of silylated layer 22 will be available to resist subsequent etching and implantation steps. The organosilicon compound may be selected from a group consisting of allyltrimethylsilane (ATMS), hexamethyldisilane (HMDSilane), 1,3-diisobutyl-1,1,3,3-tetramethyldisilazane, 1,1,3,3-tetramethyldisilazane (TMDS), n,n-dimethylamino-trimethylsilane (TMSDMA), n,n-diethylaminotrimethylsilane (TMSDEA), hexamethyldisilazane (HMDS), heptamethyldisilazane(HeptaMDS), and the following poly-functional silylating agents: 1,1,3,3,5,5-hexamethylcyclotrisilazane (HMCTS), bis(-dimethylamino)dimethylsilane (BIDMAIDS), and bis(-dimethylamino)methylsilane (B[DMA]MS), or mixtures thereof. The silicon carrier compound then reacts with the upper portion 22 to create a silylated layer. Silylated layer 22 should be at least 100 to 300 nanometers thick, but not so thick that its bottom margin 26 touches any part of the surface 12 of the workpiece 10. The silylation should continue until portion 22 of resist layer 20 contains enough silicon to make it resistant to an oxygen plasma. Portion 22 of the resist layer 20 may have, for example, between 8 and 10% by weight silicon in order to have good oxygen plasma etch resistance. The silylated layer 22 should have a thickness that is a relatively small fraction of the total, such as one third of the layer. It is preferred that the silylation layer be about 500 Angstroms thick.

The layer 20 should be approximately 1.5 microns thick. A layer 20 that is significantly thicker than this may result in coating non-uniformity, while a significantly thinner layer may not be sufficient to planarize a high-relief surface 12.

One of the technical advantages of the invention is that the parameters of the silylation step are not critical, that is, they do not have to be closely controlled. Instead of selective silylation of the surface, as per the DESIRE and SABRE processes, the entire layer 22 is silylated. In these prior art processes, the temperature and time of silylation had to be carefully controlled in order to get selective silylation. Failure to keep within close parameter tolerances results in blanket, nonselective silylation, or insufficient silylation. Because the step shown in FIG. 2 is a blanket silylation, all that is necessary is that the silylation be complete and sufficiently thick to produce a hard, oxide etch-resistant mask.

While the present invention is described herein primarily in conjunction with organosilicon compounds, other metals may be used in the place of silicon to produce a metallized layer 22. The metal should be chosen such that the metal oxide is resistant to a subsequent plasma etch that is however effective to etch non-metallized regions, as will hereinafter be described.

The silylation may proceed by any of several methods. One such method is to entrain hexamethyldisilazane or other organosilicon compound and an inert gas such as nitrogen. The pressure inside the reactor in which the entrained organosilicon compound is introduced can be about 1000 torr. The wafer or workpiece 10 should be heated in order to decrease the time of silylation.

Another way to get the silylation desired is a wet process in which HMDS or other liquid organosilicon compound is used to treat the surface of the layer 20, impregnating layer 20 to create the silylated layer 22.

The temperature inside the silylation reactor is preferably elevated up to as much as 150° C. in order to speed the silylation reaction. It is preferred that the temperature be approximately 130° C.

Figure 3:
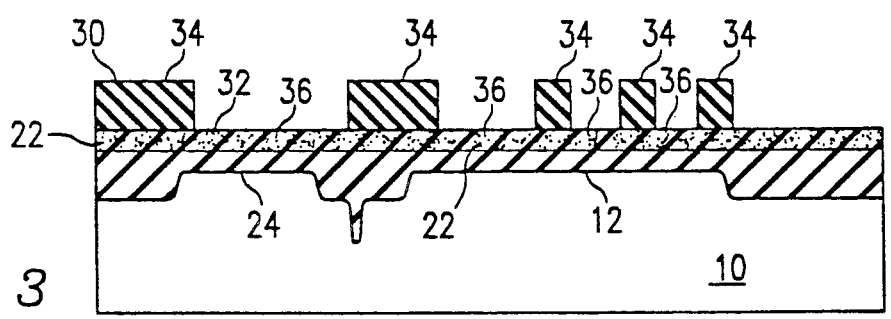

In FIG. 3, a second, imaging layer 30 of photoresist has been deposited on an upper surface 32 of the silylated layer 22. The second layer 30 of photoresist can be any photoresist that is sensitive to one or more preselected wavelengths of light, such as the g-line (436 nm), the i-line (465 nm) or deep ultraviolet (248 nm) wavelengths of light. Layer 30 will typically include a photoactive compound such as a bis aryl azide. One resist that is suitable is TSMR V-3 photoresist manufactured by Tokyo Ohka Kogyo Co. Ltd., Kawasaki, Japan.

A stepper is then used to selectively expose the layer 30 to the preselected wavelength of radiation. The photoresist may be a negative photoresist such that exposure to the preselected wavelength will make it less susceptible to solution in a developing compound, or it may be a positive resist that makes the exposed portions of the photoresist layer more susceptible to development. An example of an available positive photoresist is TSMR V-3 (g-line); an example of an available negative photoresist is Shipley SNR-248 (deep UV).

In either case, photoresist imaging layer 30 is developed to leave regions 34 while exposing portions 36 of the silylated layer 22. The developed photoresist layer 30 is then used as a mask for a subsequent oxide-specific, anisotropic plasma etch of the exposed portions 36. This may, for example, be a plasma formed from carbon tetrafluoride entrained in argon, or any other anisotropic reactive ion etch that is specific to oxides of the selected metal used to metallize layer 22. The plasma is formed in a conventional manner, using a plasma generator at 13.56 Megahertz and a power of 85-90 Watts, for example, and an electrode spacing of 5 centimeters. Other etchants can be used, such as a combination of carbon tetrafluoride and hydrogen; hexafluoroethane; octafluoropropane; or trifluoromethane. The pressure inside the etching chamber can be approximately 100 millitorr, and the temperature should preferably be ambient. The silylated layer 22 can be sputtered in a reactive ion etch-oxygen plasma, but the preferred method is a low pressure etch with a fluorine chemistry. One can use trifluoroethane and oxygen in 1:2 and 1:3 ratios to achieve good results.

Figure 4:
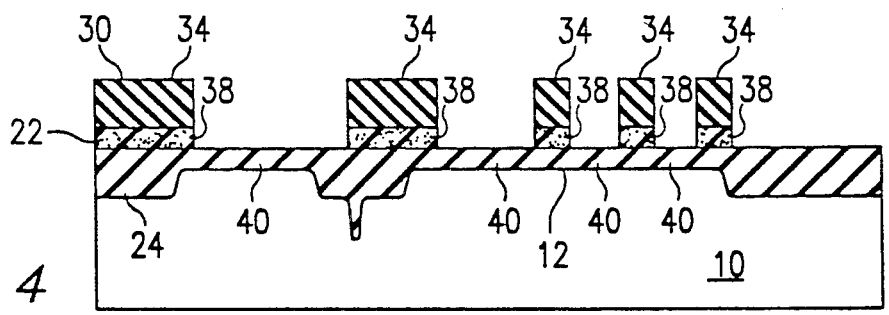

After etching away the portions 36, there are left protected portions 38 of the silylated layer 22 immediately underneath the regions 34 left from the development of photoresist 30, as shown in FIG. 4. The anisotropic etch of the regions 36 leaves exposed portions 40 of the non-silylated resist layer 24.

A second etchant is then used to etch away the exposed portions 40 of the photoresist layer 24. Any etchant may be used which selectively etches the non-silylated resist layer 24 may be used. In the case where layer 24 is a non-silylated novolak resist, an oxygen plasma may be used. The etch continues until a monitored carbon monoxide emission line either disappears or is attenuated, showing the etch end point, and thereby indicating that the regions 40 have been completely removed from the surface 12, as shown in FIG. 5.

Figure 5:
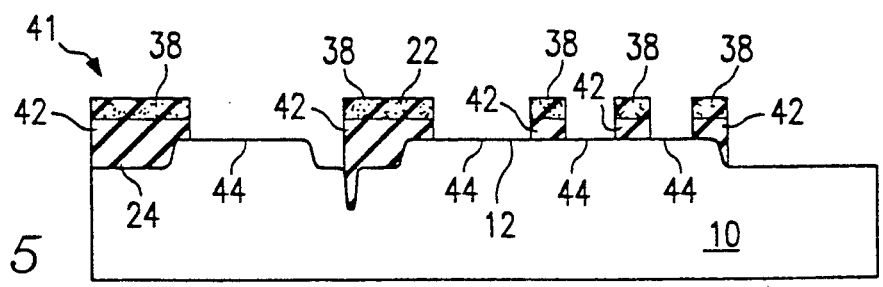

FIG. 5 shows a resultant finished mask indicated generally at 41 on the surface 12 of the semiconductor workpiece 10. The mask includes silylated portions 38 and etched portions 42 left over from the resist-specific etch just performed. Areas 44 of the surface 12 have been exposed for further processing. Subsequent steps using the mask 41 include implantation steps, deposition steps and/or etching steps. In this way, there is achieved a silylated mask which is tolerant of differences in topography and which does not have the critically narrow process parameters of prior art silylated mask systems.

EXAMPLE

A silicon wafer was coated with a silylable photoresist UCB'S "PLASMASK ®" silylable photoresist to a depth of about 15000 Angstroms. Next, the wafer was placed in a reactor and nitrogen saturated with hexamethyldisilazane vapor was introduced. The pressure inside the reactor was 1000 Torr. The wafer was placed on a hot plate in the reactor which kept the temperature of the wafer at about 150° C. The silylation occurred during a period of about 180 seconds. The thickness of the silylated layer was later determined to be approximately 700 Angstroms.

On top of this planarization layer, a resolution layer of TSMR V-3 photoresist was spun on and patterned. The exposure time of the TSMRV-3 layer was 600 milliseconds. The developed TSMR V-3 layer was used as a mask for an etch of the silylated "PLASMASK ®" layer immediately beneath it. A combination oxygen/hexafluoroethane plasma was introduced into the chamber at a five to one ratio, and at a total volumetric flow of 18 standard cubic centimeter per minute where the volume of the etch chamber was approximately 1000 cubic centimeters. This etch ran for 40 seconds. This etch was followed by a 680 second etch with a low pressure, pure oxygen plasma at 10 m Tort to etch the photoresist under the silylation layer. The sample was thereafter dipped in a 1:100 hydrofluoric acid solution to eliminate some polymeric residue observed after the etch. The power for the $C_2F_6/O_2$ etch was approximately 90 watts, and the reflected power approximately 13 watts, with a voltage bias of about −8 volts. Good definition was obtained for 0.8 micron features.

In general, it has been determined that the exposure times for the imaging layer should be increased over those that would normally be performed in order to counterbalance the loss of light that would normally have been reflected off of the semiconductor substrate. This is because the photoresist appears to be strongly absorbent. Standing wave effects, notching and other reflection problems were eliminated.

While preferred embodiments and their advantages have been described in the above-detailed description, the invention is not limited thereto, but only by the scope and spirit of the appended claims.

What is claimed is:

1. A process for creating a mask on the surface of an integrated circuit workpiece, comprising the steps of:
   applying a first layer of resist to the surface of the workpiece;
   exposing an upper surface of the first layer to an organometallic compound;
   responsive to said step of exposing, metallizing an upper portion of the first layer, a lower portion of the first layer remote from the upper surface left unmetallized;
   applying a second layer of resist to the upper surface of the first layer, the second layer being photosensitive to at least one preselected wavelength of light;
   selectively exposing the second layer to the preselected wavelength;
   developing the selectively exposed second layer to create orifices in the second layer and uncover respective areas of the metallized upper portion of the first layer;
   using the developed second layer as a mask, etching the respective areas of the metallized upper portion of the first layer using an etchant which removes said metallized upper portion but does not remove said unmetallized lower portion to expose respective areas of the lower portion of the first layer; and
   using the etched metallized upper portion as a mask, etching lower portion of the first layer to expose respective portions of the surface of the workpiece.

2. The process of claim 1, wherein said organometallic compound is an organosilicon compound and wherein the metallized upper portion is silylated.

3. The process of claim 2, wherein said organosilicon compound is selected from the group consisting of allyltrimethylsilane (ATMS), hexamethyldisilane (HMDSilane), 1,3-diisobutyl-1,1,3,3-tetramethyldisilazane, 1,1,3,3-tetramethyldisilazane (TMDS), n,n-dimethylamino-trimethylsilane (TMSDMA), n,n-diethylaminotrimethylsilane (TMSDEA), hexamethyldisilazane (HMDS), heptamethyldisilazane(HeptaMDS), 1,1,3,3,5,5-hexamethylcyclotrisilazane (HMCTS), bis(-dimethylamino)dimethylsilane (BIDMAIDS), bis(-dimethylamino)methylsilane (B[DMA]MS) and mixtures thereof.

4. The process of claim 1, wherein said step of exposing comprises the steps of:
   entraining a vapor of said organometallic compound in a carrier gas; and
   introducing the entrained organometallic vapor into a chamber containing the workpiece.

5. The process of claim 1, wherein said step of exposing comprises contacting liquid organometallic compound with the upper surface of the first layer.

6. The process of claim 1, wherein said first layer comprises an organic polymer having bonding site for metal atoms.

7. The process of claim 6, wherein said bonding sites for the metal atoms are hydroxyl groups.

8. The process of claim 6, wherein said organic polymer comprises Novolak resin.

9. The process of claim 1, wherein the workpiece has a topographical relief between a lowest point and a highest point of the workpiece surface, and wherein said first layer is of sufficiently thickness that the upper surface thereof is substantially planar and wherein said metallizing of the upper portion of the first layer is such that a thickness of said unmetallized lower portion of said first layer exceeds said relief.

10. The process of claim 1, wherein said preselected wavelength is the I-line of ultraviolet light (365 nm).

11. The process of claim 1, wherein said preselected wavelength is the G-line of ultraviolet light (436 nm).

12. The process of claim 1, wherein said preselected wavelength is about 248 nm.

13. A process for creating a mask on the surface of an integrated circuit workpiece, comprising the steps of:
   applying a first layer of resist to the surface of the workpiece, said first layer containing essentially no photoactive compound;
   exposing an upper surface of the first layer to an organometallic compound;
   responsive to said step of exposing, metallizing an upper portion of the first layer, a lower portion of the first layer remote from the upper surface left unmetallized;
   applying a second layer of resist to the upper surface of the first layer, the second layer being photosensitive to at least one preselected wavelength of light;
   selectively exposing the second layer to the preselected wavelength;
   developing the selectively exposed second layer to create orifices in the second layer and uncover respective areas of the metallized upper portion of the first layer;
   using the developed second layer as a mask, etching the respective areas of the metallized upper portion of the fist layer using an etchant which removes said metallized upper portion but does not remove said unmetallized lower portion to expose respective areas of the lower portion of the first layer; and
   using the etched metallized upper portion as a mask, etching lower portion of the first layer to expose respective portions of the surface of the workpiece.

14. A process for fabricating an integrated circuit at the surface of an integrated circuit workpiece, comprising the steps of:
   applying a first layer of resist capable of silylation to the surface of the workpiece;
   exposing an upper surface of the first layer to an organosilicon compound;
   responsive to said step of exposing, silylating an upper portion of the first layer, a lower portion of the first layer remote from the upper surface left unsilylated;
   applying a second layer of resist to the upper surface of the first layer, the second layer being photosensitive to at least one preselected wavelength of light;
   selectively exposing the second layer to the preselected wavelength;
   developing the selectively exposed second layer to create a pattern including orifices in the second layer and uncover respective areas of the silylated upper portion of the first layer;
   using the developed second layer as a mask, etching the respective areas of said silylated upper portion of the first layer using an etchant which preferentially etches said silylated upper portion in comparison with said unsilylated lower portion of said first layer, to expose respective areas of said lower portion of said first layer;
   using the etched silylated upper portion as a mask, etching lower portion of the first layer to expose respective portions of the surface of the workpiece to create an integrated circuit process mask.

15. The process of claim 14, wherein said steps further comprise implanting a dopant into the exposed portions of the integrated circuit workpiece.

16. The process of claim 14, wherein said steps further comprise forming a layer of material on the integrated circuit workpiece surface with said exposed respective portions thereof.

17. The process of claim 14, wherein said steps further comprise etching the integrated circuit workpiece surface within said respective exposed portions thereof.

* * * * *